United States Patent [19]

Sciortino, Jr. et al.

[11] Patent Number: 5,091,799
[45] Date of Patent: Feb. 25, 1992

[54] BURIED HETEROSTRUCTURE LASER MODULATOR

[75] Inventors: John C. Sciortino, Jr., Springfield, Va.; Daniel L. Rode, St. Louis, Mo.

[73] Assignee: The United States of America as represented by the Secretary of the Navy, Washington, D.C.

[21] Appl. No.: 607,390

[22] Filed: Oct. 31, 1990

[51] Int. Cl.$^5$ .................. H01S 3/19; B44C 1/22; C03C 15/00
[52] U.S. Cl. .................. 359/254; 357/252; 357/278; 385/8
[58] Field of Search .......... 357/16, 17; 372/46, 372/50; 350/96.13, 356; 359/252, 254, 278; 305/8

[56] References Cited

U.S. PATENT DOCUMENTS

| | | | |
|---|---|---|---|
| 3,758,875 | 9/1973 | Hayashi | 331/94.5 |
| 3,780,358 | 12/1973 | Thompson | 317/235 R |
| 3,893,044 | 7/1975 | Dumke et al. | 331/94.5 |
| 4,121,177 | 10/1978 | Tsukada | 331/94.5 |
| 4,408,330 | 10/1983 | An | 372/45 |
| 4,635,264 | 1/1987 | Goebel et al. | 372/18 |
| 4,720,468 | 1/1988 | Menigaux et al. | 372/50 |
| 4,733,399 | 3/1988 | Mihashi et al. | 371/50 |
| 4,745,592 | 5/1988 | Gabniagues | 370/3 |
| 4,747,107 | 5/1988 | Miller | 372/50 |
| 4,759,023 | 7/1988 | Yamagachi | 372/50 |
| 4,759,080 | 7/1988 | Emura et al. | 455/617 |
| 4,802,187 | 1/1989 | Bouley et al. | 372/46 |
| 4,805,179 | 2/1989 | Harder et al. | 372/50 |
| 4,815,083 | 3/1989 | Sugou et al. | 372/46 |
| 4,928,285 | 5/1990 | Kushibe et al. | 372/45 |
| 4,987,468 | 1/1991 | Thornton | 357/16 |

OTHER PUBLICATIONS

Carriere et al., "An Optimized Buried Heterostructure Laser . . . "; Ann. Telecanomun., vol. 43, #1–2, pp. 78–8, 2/88 Abst. only.

Mito et al., "InGaAsP Double-Channel–Planar-Buried-Heterostructure Laser Diode (DC-PBH LD) With Effective Current Confirnement", Journal of Lightwave Technology, vol. LT-1, Mar. 1983, pp. 195–202.

Primary Examiner—Nelson Moskowitz
Attorney, Agent, or Firm—Thomas E. McDonnell; Edward F. Miles

[57] ABSTRACT

A buried-heterostructure laser modulator for modulating a laser beam includes two adjacent thin epitaxial first layers of oppositely doped semi-conductor material and a thin epitaxial buried layer of undoped semi-conductor material located between the two adjacent first layers. The buried layer forms a single mode optical channel having a width larger than a height thereof with the width equal to or greater than a width of a diffraction limited waveguide mode of the laser beam. Two thin epitaxial second layers of similarly and heavily doped semiconductor material are provided respectively adjacent the respective first layers of the same doping. One of these second layers is provided on a side of a semi-insulating substrate and two strip lines of opposite bias are provided on the side of the substrate and connect to a respective second layer of the same bias. The two adjacent first layers are preferably AlGaAs and the buried layer is preferably GaAs with a width less than about 1.5 microns and a height about 0.2 microns.

7 Claims, 1 Drawing Sheet

BURIED HETEROSTRUCTURE LASER MODULATOR

FIELD OF THE INVENTION

The present invention relates generally to heterostructure types of laser modulators, and more particularly to a heterostructure laser modulator having a buried waveguide that can accept and output a modulated laser beam having a generally circular cross section rather than an exaggerated elliptical cross section.

BACKGROUND OF THE INVENTION

In connection with optical communications, optical signal processing, or optical computing, it is often necessary to rapidly modulate the intensity of an optical signal, such as a laser beam, by some electronic means. In the case of laser beams derived from semiconductor devices, this function is conveniently performed by means of heterostructure laser modulator. Heterostructure laser modulators possess the advantages of small size, robustness and long-term reliability.

In heterostructure laser modulators as known in the art, the internal structure of the modulator is based upon a series of stacked, wide and thin layers of differing semiconductor materials disposed on a semiconductor substrate. Such a stacked assembly is known generally as a "heterostructure", and it is fabricated by epitaxial semiconductor material growth techniques familiar to those acquainted with the state of the art. The resulting heterostructure laser modulator requires that the carrier input and output laser beams be shaped into a wide, yet thin cross-sectional beam to accommodate the semiconductor layer structure comprising the modulator. This requirement for beam shaping constitutes a serious disadvantage for conventional heterostructure laser modulators in terms of complexity and cost. In addition, it is required that the laser beam be carefully tailored to contain large and specific levels of astigmatism, which is detrimental to the reliability and ruggedness of the laser modulator.

To operate, the heterostructure requires a biasing potential across this stack. Previous heterostructure modulators do this by a pair of striplines, one connected electrically to the topmost layer of the heterostructure, the other to the bottommost (bottommost being the active layer of the heterostructure disposed most closely to the substrate). Because of the stacked arrangement of the heterostructure layers, there is no ready access to the bottommost layer by which one can effect electrical connection. Previous laser modulators gained access by running one of the striplines along the substrate face that was opposite to the face on which the heterostructure resided, and forming a path through the substrate to the heterostructure. However, by running the two biasing striplines along faces so widely separated from one another, one introduces considerable inductance into the modulator circuit, which effectively precludes operation of the modulator at microwave frequencies, or higher.

SUMMARY OF THE INVENTION

In accordance With the present invention, a buried-heterostructure laser modulator for modulating a laser beam includes two adjacent thin epitaxial layers of oppositely doped semiconductor material. A thin epitaxial buried layer of undoped semiconductor material is located between the adjacent layers and surrounded thereby. The buried layer forms a single mode optical channel having a height larger than a height thereof with the width equal to or greater than a width of a diffraction limited waveguide mode of the laser beam. Two thin epitaxial second layers of similarly and heavily doped semiconductor material are provided respectively adjacent the respective first layer of the same doping. One of these second layers is provided on a side of a semi-insulating substrate and two strip lines of opposite bias are provided on the side of the substrate and connect to a respective second layer of the same bias.

The bottommost layer of the heterostructure has a portion, called a pad portion, which extends generally along the face of the substrate a sufficient distance to be physically clear of the stacked heterostructure, so as to permit electrical connection to a stripline on this face of the substrate. This permits one to run both biasing striplines for the heterostructure on this same face near to one another, thus reducing the inductance of the modulator.

In a preferred embodiment of the invention, the two first layers are AlGaAs and the buried layer is GaAs. In addition, the two second layers are similarly and heavily doped GaAs. The width of the buried layer is also less than about 1.5 microns, while the height of the buried layer is about 0.2 microns.

In the present invention, a buried heterostructure laser modulator is provided that comprises thin semiconductor layers which are narrowly shaped to fit the natural contours of conventional round laser beams so that the laser beam is virtually free of astigmatism. In this manner, all the usual advantages of heterostructure waveguide modulators are retained. At the same time, the added desirable features of the use of round astigmatism-free input and output laser beams are incorporated in the disclosed laser modulator of the invention, as is also the use of inexpensive spherical lenses which are less costly and fewer in number than the beam-shaping methods found in the prior art.

Other features and advantages of the invention will be set forth in, or will be apparent from, the detailed description of the preferred embodiments of the invention which follow.

BRIEF DESCRIPTION OF THE DRAWINGS

The invention will become more readily apparent from the following exemplary description taken in conjunction with the accompanying drawings, in which.

DETAILED DESCRIPTION OF THE PREFERRED EMBODIMENTS

Figure 1:
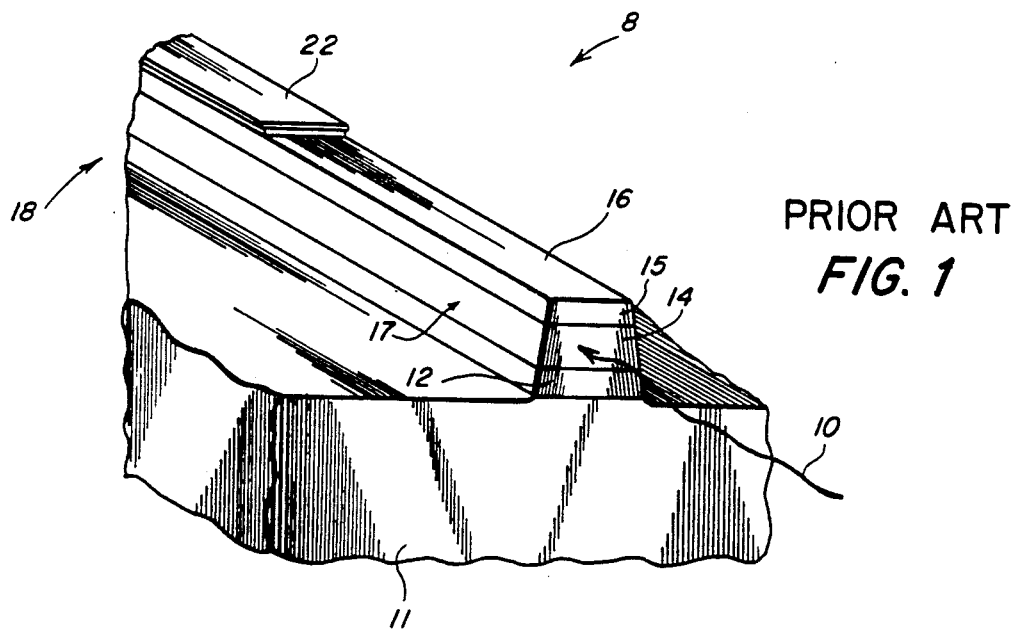
FIG. 1 is an isometric elevational view of a heterostructure laser modulator as known in the art.

FIG. 1 shows a heterostructure laser modulator 8 as known in the art which is used for receiving and modulating a laser beam 10. The heterostructure of laser modulator 8 comprises a substrate 11 with a layer 12 of aluminum-gallium-arsenide (AlGaAs) formed on the top thereof, with a layer 14 of gallium-arsenide (GaAs) adjacent thereto, with an AlGaAs layer 15 formed on the top of the GaAs layer 14, and with a waveguide cladding 16 on top of AlGaAs layer 15. GaAs layer 14 forms an optical waveguide 17 etched into the semiconductor heterostructure for receiving laser beam 10.

GaAs and AlGaAs are preferred because their indices of refraction are 3.6, and between 3.4 and 3.5, respectively, which in conjunction with a judicious choice of the physical dimensions of waveguiding layer 37, permits heterostructure 24 to transmit optical signals in a single mode, diffraction limited, manner. By this one means that an optical signal shot directly into waveguiding layer 37 will occupy the same volume (i.e. not spread out) as it traverses 37, nor will it bounce off the waveguiding "walls" of layers 32 or 34, but rather will travel down the middle of 37. Thus a signal having a particular shape as it enters 37 will have that shape as it exits, eliminating the need for complicated optics to compensate for spreading of the signal in the heterostructure. A single mode signal of circular cross-section entering layer 37 will exit as a single mode signal of circular cross-section.

Laser beam 10 travels down optical waveguide 17 to a modulator region 18. In modulator region 18, the frequency $f_1$ of laser beam 10 is modulated by a signal $f_2$, where $f_1 >> f_2$. An electrical contact region 22 is typically used for applying the modulating signal $f_2$ to laser beam 10.

In the existing type of heterostructure laser modulator 8 of FIG. 1, received laser beam 10, in order to be efficiently guided within optical waveguide 17 to modulator section 18 thereof and thence to an output aperture (not shown in FIG. 1), must be focused within the plane parallel to the planes of the semiconductor layer 14 (the plane perpendicular to signal propagation) to a convergence angle of about two to six degrees of arc. However, within the plane perpendicular to the plane of semiconductor layer 14, input laser beam 10 must also be focused to a convergence angle of forty to sixty degrees of arc. This extreme "ellipticity" of laser beam 10 gives rise to large amounts of astigmatism, but the ellipticity is required by such conventional heterostructure laser modulators for efficient operation.

In laser modulator 8, the achievement of the necessary highly astigmatic and/or elliptical laser beam is accomplished by use of expensive elliptical optics or by use of complex combinations of spherical and cylindrical optical elements such as lenses and mirrors. These approaches generally do not permit very small spatial separations between heterostructure laser modulator 8 and the optical elements since the latter are necessarily complex and bulky. Hence, this approach has the disadvantages of complexity and cost of assembly, tedious adjustment requirements, bulky size and operational fragility.

Figure 2:
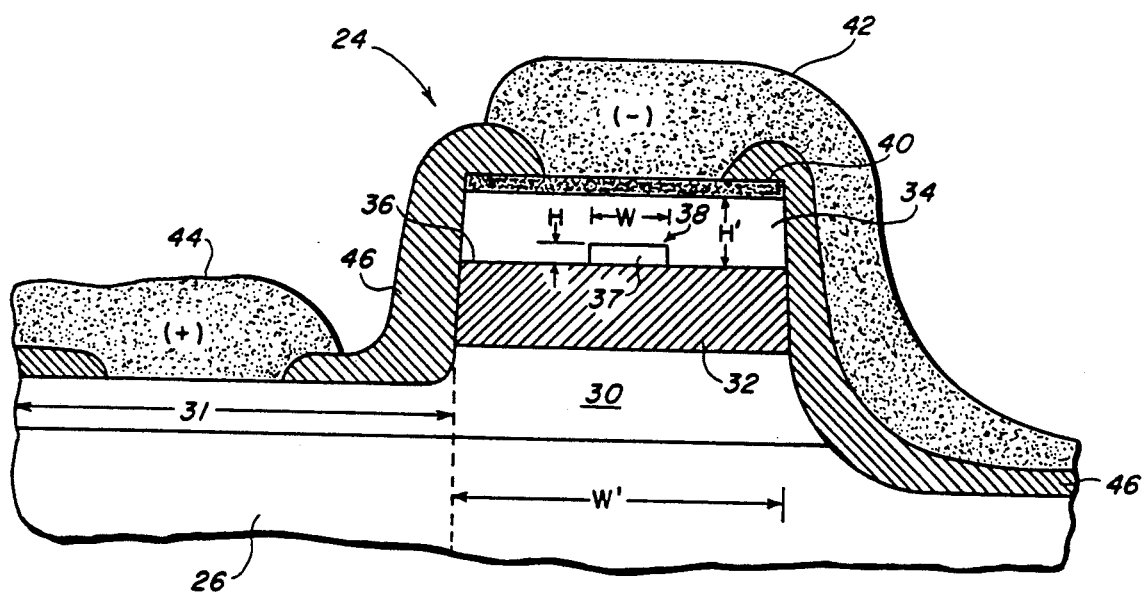
FIG. 2 is a cross-sectional illustration of a heterostructure laser modulator comprising a buried waveguide according to the present invention.

The present invention circumvents the need for costly and complex optical focusing elements by use of a narrow buried-heterostructure laser modulator 24, as depicted in FIG. 2. Laser modulator 24, similar to laser modulator 8, has a planar structure of semiconductor heterostructure layers 30, 32, 37, 34, 40, and is formed on a substrate 26. A layer 30 of heavily doped gallium-arsenide (n+- GaAs) is formed on the top surface of substrate 26. Two layers of AlGaAs are formed thereabove, an N-doped AlGaAs layer 32 on the top of n+- GaAs layer 30 and a P-doped AlGaAs layer 34 thereabove such that a common boundary line 36 of layers 32 and 34 forms a P-N junction. Situated or "buried" at the juncture indicated in FIG. 2 by line 36 is a layer 37 of undoped GaAs which comprises a waveguide or optical channel 38 for receiving a laser beam. The width of heterostructure 30, 32, 37, 34, 40, is indicated by the width W'.

Provided on top of AlGaAs layer 34 is a top most p+ GaAs layer 40. Electrically connected to layer 40 is a negative strip line 42 of P- metal which serves to provide a negative bias. Extending beyond the width W' of the heterostructure is a portion 31 of bottommost heterostructure layer 30. Portion 31 forms a pad for electrical connection to positive strip line 44 of N-metal which provides a positive bias to the heterostructure. Surrounding laser modulator 24 and provided between negative strip line 42 and positive strip line 44 is a dielectric 46.

It should be appreciated that this configuration of laser modulator 24 allows laser modulator 24 to be a planar structure with both strip lines 42 and 44 provided on a top side of semi-insulating substrate 26. Electrical connection is then made to the P-N junction formed by layers 32 and 34 through respective heavily doped layers 30 and 40. This configuration, with striplines 42, 44, on the same face 33 of substrate 31, increases the frequency range of modulator 24 up to and over 20 GHz, which is roughly the present upper frequency limit of this technology. This invention should permit operation up to 40 GHz. The increase in bandwidth results from reduction of the inductance between striplines 42, 44, by locating them so close together.

Optical channel 38 and surrounding layers 32 and 34 are constructed from thin epitaxial layers of AlGaAs and GaAs which are grown by well-known techniques. However, GaAs layer 37 of optical channel 38 is patterned or sized along the dimension (width) parallel to the plane of epitaxial layers 32 and 34 such that GaAs layer 37 essentially equals or is less than the width of the diffraction-limited waveguide mode which yields the diffraction-limited output and input laser beams for single-mode operation. In the GaAs/AlGaAs heterostructure laser modulator 24 shown in FIG. 2, the buried GaAs layer 37 has a width dimension W, measured parallel to the plane of the epitaxial layers, of about 1.5 microns. GaAs layer 37 also has a height H, measured perpendicular to the plane of epitaxial layers 32 and 34 as indicated in FIG. 2, of approximately 0.2 microns. Height H' of the surrounding P-doped AlGaAs layer 34 and the N-doped AlGaAs layer 32, measured as shown in FIG. 2, are each approximately 2 microns. The overall width W of laser modulator 24 is about 6 microns.

With these exemplary dimensions, the input and output laser beams of laser modulator 24 are diffraction limited, with a numerical aperture which is correspondingly relatively large and on the order of 0.34 to 0.50. Consequently, the required and resulting astigmatism in the input and output laser beams, respectively, is greatly reduced and simple conventional optics can be used to shape the laser beams. Since conventional spherical optical elements can be used exclusively with buried-heterostructure laser modulator 24, and since such elements are commercially available in quite small geometries, the overall assembly is low in cost and parts count, and highly miniaturized into a rugged and reliable assembly. Furthermore, no separate adjustment of laser beam focus is required along the two mutually perpendicular laser beam cross section dimensions because the now circular cross section laser beam is characterized by only a single dimension and focal point.

Thus, buried heterostructure laser modulator 24 permits the exclusive use of conventional spherical optical elements, such as plano-convex spherical lenses, for shaping the input and output laser beams. Aside from improvements in cost and complexity factors, this arrangement leads to more compact and rugged assemblies which are more field-reliable and easier to assemble and adjust. Lastly, as FIG. 2 implies, the electrical contact-area shown by the P-metal region 42 can be greatly enlarged in comparison to the width of buried GaAs layer 37. This feature eases the difficulty of device assembly while still providing for high-frequency operation up to about 40 GHz.

Alternative embodiments of laser modulator 24 according to the invention are also possible based upon the fact that both the heterostructure laser modulator and the buried-heterostructure laser modulator rely on the electroabsorption effect to provide laser beam intensity modulation. Since this effect is closely allied with the well-defined energy band structure of crystalline materials, the buried heterostructure laser modulator concept can be extended to other semiconductors such as those containing silicon and germanium, or aluminum and indium, or phosphorous and antimony, as well as cadmium, zinc, mercury, sulphur, selenium, and tellurium. Furthermore, ultrathin semiconductor layers such as superlattices, pseudomorphic structures, and strained-layer superlattices can also be substituted for any of the individual layers depicted in FIG. 2.

In some cases, it may furthermore be desirable to employ two or more buried regions under a single metal bias layer, any of these several regions being routed beneath other regions of controlling metal bias layers as well, all for the purposes of mixing and multiplexing various electrical and optical signals together in suitable combinations to effect optical computing and signal processing functions. There is no intrinsic limit to the number and variety of such combinations of single-mode buried optical paths and controlling metal bias regions which can be effected to achieve greater levels of system functionality.

It should be appreciated that the laser modulator of the present invention is particularly useful for signal processing and communication applications. It can be used for applying large bandwidth signals or data onto a single optical carrier for subsequent processing or transmission. With such a laser modulator, a potential one or two orders of magnitude advantage is possible in link efficiency for communications and bandwidth efficiency for optical signal processing compared with present technology. Utilization in optical computers is also possible. Finally, the laser modulator of the present invention can provide modulation bandwidths extending beyond the microwave range and potentially into the millimeter wave range.

Although the present invention has been described relative to exemplary embodiments thereof, it will be understood by those skilled in the art that variations and modifications, such as complementary types, and electro-refraction embodiments, can be effected in these exemplary embodiments without departing from the scope and spirit of the invention.

We claim:

1. A buried-heterostructure laser modulator for modulating a laser beam comprising:
   two adjacent epitaxial first layers of oppositely doped semiconductor material which form a P-N junction;
   an epitaxial buried layer of undoped semiconductor material located at the junction of said first layers and surrounded thereby, said buried layer forming a single mode optical channel having a width larger than a height thereof with the width less than or equal to a width of a diffraction limited waveguide mode of the laser beam;
   two epitaxial second layers of doped semiconductor material, said second layers being of opposite doping and being respectively adjacent said first layer of the same doping;
   a semi-insulating substrate on one side of which one of said second layers is provided; and
   two strip lines provided on the one side of said substrate, said strip lines being of opposite bias and connecting to a respective said second layer of the same bias.

2. A laser modulator as claimed in claim 1 wherein said two first layers are AlGaAs and said buried layer is GaAs.

3. A laser modulator as claimed in claim 2 wherein said second layers are similarly and heavily doped GaAs.

4. A laser modulator as claimed in claim 3 wherein the width of said buried layer is less than about 1.5 microns.

5. A laser modulator as claimed in claim 4 wherein the height of said buried layer is about 0.2 microns.

6. A laser modulator as claimed in claim 3 wherein said heavily doped second layers have an electrical contact width larger than the width of said buried layer.

7. A heterostructure device comprising:
   a substrate having a plurality of faces;
   a plurality of heterostructure layers disposed one atop another proceeding outwards from one face of said plurality of faces;
   a pair of biasing connectors for electrically biasing said heterostructure device;
   wherein one layer of said plurality of layers has a pad portion extending substantially along said one face a distance away from said heterostructure.

* * * * *